United States Patent
Chen et al.

(10) Patent No.: US 6,914,320 B2
(45) Date of Patent: Jul. 5, 2005

(54) BILAYER HDP CVD/PE CVD CAP IN ADVANCED BEOL INTERCONNECT STRUCTURES AND METHOD THEREOF

(75) Inventors: Tze-Chiang Chen, Yorktown Heights, NY (US); Brett H. Engel, Wappingers Falls, NY (US); John A. Fitzsimmons, Poughkeepsie, NY (US); Terence Kane, Wappingers Falls, NY (US); Naftall E. Lustig, Croton on Hudson, NY (US); Ann McDonald, New Windsor, NY (US); Vincent McGahay, Poughkeepsie, NY (US); Soon-Cheon Seo, White Plains, NY (US); Anthony K. Stamper, Williston, VT (US); Yun Yu Wang, Poughquag, NY (US); Erdem Kaltalioglu, Wappingers Falls, NY (US)

(73) Assignees: International Business Machines Corporation, Armonk, NY (US); Infineon Technologies AG, Munich (DE)

( * ) Notice: Subject to any disclaimer, the term of this patent is extended or adjusted under 35 U.S.C. 154(b) by 0 days.

(21) Appl. No.: 10/807,029

(22) Filed: Mar. 23, 2004

(65) Prior Publication Data

US 2004/0173907 A1 Sep. 9, 2004

Related U.S. Application Data

(60) Continuation of application No. 10/650,890, filed on Aug. 28, 2003, now Pat. No. 6,887,783, which is a division of application No. 10/047,964, filed on Jan. 15, 2002, now abandoned.

(51) Int. Cl.$^7$ .............................................. H01L 23/58
(52) U.S. Cl. ........................ 257/652; 257/753; 438/631
(58) Field of Search ......................... 438/622–634, 438/642–657, 787–794, 902; 257/640–652, 750–753

(56) References Cited

U.S. PATENT DOCUMENTS

| | | | |
|---|---|---|---|
| 6,043,152 A | 3/2000 | Chang et al. | |
| 6,080,529 A | 6/2000 | Ye et al. | |

(Continued)

FOREIGN PATENT DOCUMENTS

| | | | |
|---|---|---|---|
| JP | 1111843 A | 4/1989 | |
| JP | 2001015480 A | 1/2001 | |

(Continued)

OTHER PUBLICATIONS

Soo Geun Lee et al., "Low Dielectric Constant 3MS a–SiC:H as Cu Diffusion Barrier Layer in Cu Dual Damascene Process," Japanese Journal of Applied Physics, Part 1, vol. 40, No. 4B, pp. 2663–2668, Apr. 2001.

(Continued)

*Primary Examiner*—Matthew Smith
*Assistant Examiner*—Calvin Lee
(74) *Attorney, Agent, or Firm*—Margaret A. Pepper

(57) ABSTRACT

An advanced back-end-of-line (BEOL) metallization structure is disclosed. The structure includes a bilayer diffusion barrier or cap, where the first cap layer is formed of a dielectric material preferably deposited by a high density plasma chemical vapor deposition (HDP CVD) process, and the second cap layer is formed of a dielectric material preferably deposited by a plasma-enhanced chemical vapor deposition (PE CVD) process. A method for forming the BEOL metallization structure is also disclosed. The invention is particularly useful in interconnect structure comprising low-k dielectric material for the inter-layer dielectric (ILD) and copper for the conductors.

17 Claims, 5 Drawing Sheets

U.S. PATENT DOCUMENTS

| | | |
|---|---|---|
| 6,099,701 A | 8/2000 | Liu et al. |
| 6,107,188 A | 8/2000 | Liu et al. |
| 6,127,238 A | 10/2000 | Liao et al. |
| 6,153,523 A | 11/2000 | Van Ngo et al. |
| 6,162,583 A | 12/2000 | Yang et al. |
| 6,211,061 B1 | 4/2001 | Chen et al. |
| 6,218,732 B1 | 4/2001 | Russell et al. |
| 6,225,210 B1 | 5/2001 | Ngo et al. |
| 6,235,633 B1 | 5/2001 | Jang |
| 6,261,951 B1 | 7/2001 | Buchwalter et al. |
| 6,528,432 B1 * | 3/2003 | Ngo et al. .................. 438/780 |
| 6,593,237 B1 * | 7/2003 | Ngo et al. .................. 438/687 |
| 2001/0000155 A1 | 4/2001 | Huang et al. |
| 2001/0002333 A1 | 5/2001 | Huang et al. |
| 2001/0002731 A1 | 6/2001 | Ueda |
| 2001/0003064 A1 | 6/2001 | Ohto |
| 2002/0100907 A1 * | 8/2002 | Wang .......................... 257/50 |

FOREIGN PATENT DOCUMENTS

| | | |
|---|---|---|
| JP | 2001053076 A | 2/2001 |
| WO | WO 99/33102 | 7/1999 |
| WO | WO 00/19523 | 6/2000 |

OTHER PUBLICATIONS

R.D. Goldblatt et al., "A High Performance 0.13 um Copper BEOL Technology with Low–k Dielectric," Proceedings of the IEEE 2000 International Interconnect Technology Conference, pp. 261–263, Jun. 5–7, 2000.

* cited by examiner

BILAYER HDP CVD/PE CVD CAP IN ADVANCED BEOL INTERCONNECT STRUCTURES AND METHOD THEREOF

This application is a continuation of U.S. patent application Ser. No. 10/650,890 filed Aug. 28, 2003, which is a division of U.S. patent application Ser. No. 10/047,964 filed Jan. 15, 2002.

FIELD OF THE INVENTION

This invention relates generally to the manufacture of high speed semiconductor microprocessors, application specific integrated circuits (ASICs), and other high speed integrated circuit devices. More particularly, this invention relates to a novel bilayer cap in advanced back-end-of-line (BEOL) interconnect structures for semiconductor devices using low-k dielectric materials. The invention is specifically directed to a bilayer cap comprising high-density plasma chemical vapor deposition (HDP CVD) materials and plasma-enhanced chemical vapor deposition (PE CVD) material in advanced BEOL metallization structures, and a method of forming the bilayer cap.

BACKGROUND OF THE INVENTION

In semiconductor devices, aluminum and aluminum alloys have been used as the traditional interconnect metallurgies. While aluminum-based metallurgies have been the material of choice for use as metal interconnects over the past years, concern now exists as to whether aluminum will meet the demands required as circuit density and speeds for semiconductor devices increase. Because of these growing concerns, other materials have been investigated as possible replacements for aluminum-based metallurgies.

One highly advantageous material now being considered as a potential replacement for aluminum metallurgies is copper, because of its lower susceptibility to electromigration failure as compared to aluminum, as well as its lower resistivity.

Despite these advantages, copper suffers from an important disadvantage. Copper readily diffuses into the surrounding dielectric material during subsequent processing steps. To inhibit the diffusion of copper, copper interconnects are often capped with a protective barrier layer. One method of capping involves the use of a conductive barrier layer of tantalum, titanium or tungsten, in pure or alloy form, along the sidewalls and bottom of the copper interconnection. To cap the upper surface of the copper interconnection, a dielectric material such as silicon nitride ($Si_3N_4$) is typically employed.

FIG. 1 illustrates a conventional BEOL interconnect structure utilizing copper metallization and the protective cap layers described above. The interconnect structure comprises a lower substrate 10 which may contain logic circuit elements such as transistors. A dielectric layer 12, commonly known as an inter-level dielectric (ILD), overlies the substrate 10. ILD layer 12 may be formed of silicon dioxide ($SiO_2$). However, in advanced interconnect structures, ILD layer 12 is preferably a low-k polymeric thermoset material such as SiLK™ (an aromatic hydrocarbon thermosetting polymer available from The Dow Chemical Company). An adhesion promoter layer 11 may be disposed between the substrate 10 and ILD layer 12. A layer of silicon nitride 13 is optionally disposed on ILD layer 12. Silicon nitride layer 13 is commonly known as a hardmask layer or polish stop layer. At least one conductor 15 is embedded in ILD layer 12. Conductor 15 is preferably copper in advanced interconnect structures, but alternatively may be aluminum or other conductive material. When conductor 15 is copper, a diffusion barrier liner 14 is preferably disposed between ILD layer 12 and conductor 15. Diffusion barrier liner 14 is typically comprised of tantalum, titanium, tungsten or nitrides of these metals. The top surface of conductor 15 is made coplanar with the top surface of silicon nitride layer 13, usually by a chemical-mechanical polish (CMP) step. A cap layer 16, also typically of silicon nitride, is disposed on conductor 15 and silicon nitride layer 13. Cap layer 16 acts as a diffusion barrier to prevent diffusion of copper from conductor 15 into the surrounding dielectric material during subsequent processing steps.

A first interconnect level is defined by adhesion promoter layer 11, ILD layer 12, silicon nitride layer 13, diffusion barrier liner 14, conductor 15, and cap layer 16 in the interconnect structure shown in FIG. 1. A second interconnect level, shown above the first interconnect level in FIG. 1, includes adhesion promoter layer 18, ILD layer 19, silicon nitride layer 20, diffusion barrier liner 21, conductor 22, and cap layer 23. The first and second levels may be formed by conventional damascene processes. For example, formation of the second interconnect level begins with deposition of adhesion promoter layer 18. Next, the ILD material 19 is deposited onto adhesion promoter layer 18. If the ILD material is a low-k polymeric thermoset material such as SiLK™, the ILD material is typically spin-applied, given a post apply hot bake to remove solvent, and cured at elevated temperature. Next, silicon nitride layer 20 is deposited on the ILD. Silicon nitride layer 20, ILD layer 19, adhesion promoter layer 18 and cap layer 16 are then patterned, using a conventional photolithography and etching process, to form at least one trench and via. The trenches and vias are typically lined with diffusion barrier liner 21. The trenches and vias are then filled with a metal such as copper to form conductor 22 in a conventional dual damascene process. Excess metal is removed by a CMP process. Finally, cap layer 23 is deposited on copper conductor 22 and silicon nitride layer 20.

Due to the need for low temperature processing after copper deposition, cap layers are typically deposited at temperatures below 450° C. Accordingly, cap layer deposition is typically performed using plasma-enhanced chemical vapor deposition (PE CVD) or high density plasma chemical vapor deposition (HDP CVD) wherein the deposition temperature generally ranges from about 200° C. to about 500° C.

PE CVD and HDP CVD films have been used for many other applications in semiconductor device manufacturing. However, in using a cap layer such as silicon nitride for copper interconnects, conventional PE CVD or HDP CVD silicon nitride films create reliability problems.

HDP CVD films such as silicon nitride provide superior electromigration protection, as compared to PE CVD films, because HDP CVD films more readily stop the movement of copper atoms along the interconnect surface in the cap layer. However, in a conventional HDP deposition process, a seam is formed in the HDP CVD cap layer, and a crack in the cap layer often develops at this seam due to stress within the structure. If the crack develops in a portion of the cap layer overlying a copper conductor, the copper conductor may be readily exposed to moisture and other sources of oxygen. If the crack develops in a portion of the cap layer overlying the ILD, the copper conductor may be exposed to moisture diffusing through the ILD. In the latter case, the seam is of relatively minor concern in interconnect structures utilizing silicon dioxide as the ILD material, because the rate of moisture diffusion through silicon dioxide is very low. However, in interconnect structures utilizing low-k polymeric thermoset dielectric materials such as SiLK™, this seam is of greater concern, because the rate of moisture diffusion through most spin-on and CVD low-k materials is relatively high.

Moreover, any crack in the cap layer may lead to copper diffusion into the ILD through the seam. As a result of this copper diffusion, a copper nodule may form under the cap layer through the seams. This copper nodule may lead to leakage between adjacent interconnect lines.

Another significant disadvantage occurs when HDP CVD films are integrated with low-k dielectric materials. The energetic reactions of the HDP CVD process can enable interaction with and within the low-k materials causing undesirable changes to occur.

Such changes in low-k dielectric materials can be significantly mitigated by the use of PE CVD films. Moreover, in typical PE CVD films, no seam is formed during the deposition process. For this reason, PE CVD cap layers have been used to cap copper interconnect structures in earlier ground-rule devices, such as the 0.22 μm technology node. However, in more advanced ground-rule devices, such as the 0.18 μm technology node, PE CVD films have been found to be inferior to cap layers formed by other deposition techniques such as HDP CVD.

In particular, PE CVD films generally exhibit poorer adhesion to the copper surface. Typical PE CVD silicon nitride films exhibit adhesion values in the range of about 5 to less than 10 joules/m$^2$, whereas typical HDP CVD silicon nitride films exhibit adhesion values of about 20 joules/m$^2$, as determined by a four-point bend adhesion testing technique. PE CVD films may delaminate and form blisters over patterned copper lines, particularly during subsequent dielectric depositions, metallization, and chemical-mechanical polishing. After being deposited onto copper metallurgy, additional insulating layers generally will be deposited over the cap layer. However, subsequent deposition of insulating layers onto the cap layer will produce stress which can cause the cap layer to peel from the copper surface. This delamination results in several catastrophic failure mechanisms, including lifting interlayer dielectrics, lifting copper conductors, copper diffusion from uncapped copper lines, and electromigration. Such results are generally seen in dual damascene processing where delamination of the silicon nitride hardmask layer generally occurs during copper chemical-mechanical polishing.

Thus, there is a need in the art for an interconnect structure cap layer exhibiting the superior electromigration protection and adhesion characteristics of HDP CVD films, and the superior coverage of PE CVD films.

SUMMARY OF THE INVENTION

The problems described above are addressed through use of the present invention, which is directed to an interconnect structure formed on a substrate. In a preferred embodiment, the structure comprises a dielectric layer overlying the substrate; a hardmask layer on said dielectric layer, said hardmask layer having a top surface; at least one conductor embedded in said dielectric layer and having a surface coplanar with the top surface of said hardmask layer; a first cap layer on said at least one conductor and on said hardmask layer, said first cap layer preferably being formed by a high density plasma chemical vapor deposition (HDP CVD) process; and at least one second cap layer on said first cap layer. The second cap layer may be formed by any suitable method, such as by a physical vapor deposition (PVD) process, by a spin-on process, or even by a HDP CVD process using process parameters different from those used for the first cap layer. The second cap layer is preferably formed by a plasma-enhanced chemical vapor deposition (PE CVD) process.

The present invention is also directed to a method of forming an interconnect structure on a substrate. In one embodiment, the method comprises the steps of: depositing a dielectric material on the substrate, thereby forming a dielectric layer, depositing a hardmask material on said dielectric layer, thereby forming a hardmask layer or layers, said hardmask layer having a top surface; forming at least one opening in said dielectric layer; filling said opening with a conductive material, thereby forming at least one conductor, said conductor having a surface coplanar with the top surface of said dielectric layer; depositing a first material on said conductor by a high density plasma chemical vapor deposition (HDP CVD) process, thereby forming a first cap layer; and depositing a second material on said first cap layer, preferably by a plasma-enhanced chemical vapor deposition (PE CVD) process, thereby forming a second cap layer.

BRIEF DESCRIPTION OF THE DRAWINGS

The features of the invention believed to be novel and the elements characteristic of the invention are set forth with particularity in the appended claims. The drawings are for illustration purposes only and are not drawn to scale. Furthermore, like numbers represent like features in the drawings. The invention itself, however, both as to organization and method of operation, may best be understood by reference to the detailed description which follows, taken in conjunction with the accompanying drawings, in which:

DETAILED DESCRIPTION OF THE INVENTION

The invention will now be described by reference to the accompanying figures. In the figures, various aspects of the structures have been shown and schematically represented in a simplified manner to more clearly describe and illustrate the invention. For example, the figures are not intended to be to scale. In addition, the vertical cross-sections of the various aspects of the structures are illustrated as being rectangular in shape. Those skilled in the art will appreciate, however, that with practical structures these aspects will most likely incorporate more tapered features. Moreover, the invention is not limited to constructions of any particular shape.

Although certain aspects of the invention will be described with respect to a structure comprising copper, the invention is not so limited. Although copper is the preferred conductive material, the structure of the present invention may comprise any suitable conductive material, such as aluminum.

Figure 1:
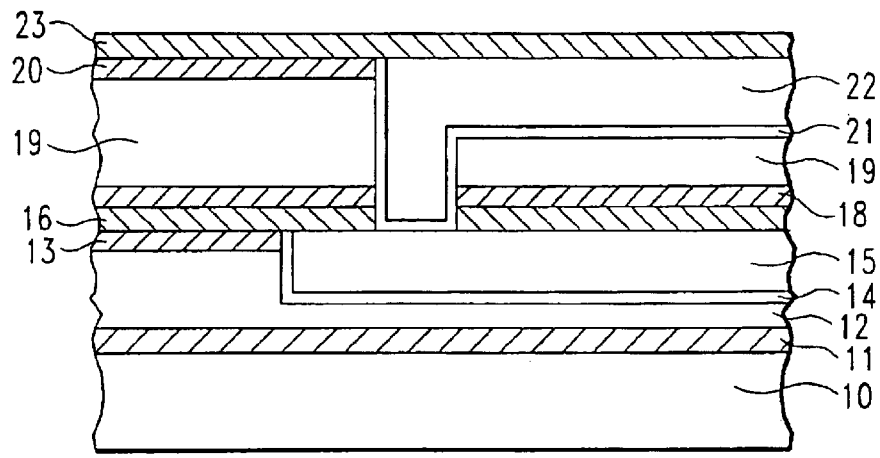
FIG. 1 is a schematic cross-sectional view of a partially-fabricated integrated circuit device illustrating a prior art interconnect structure.
Figure 2:
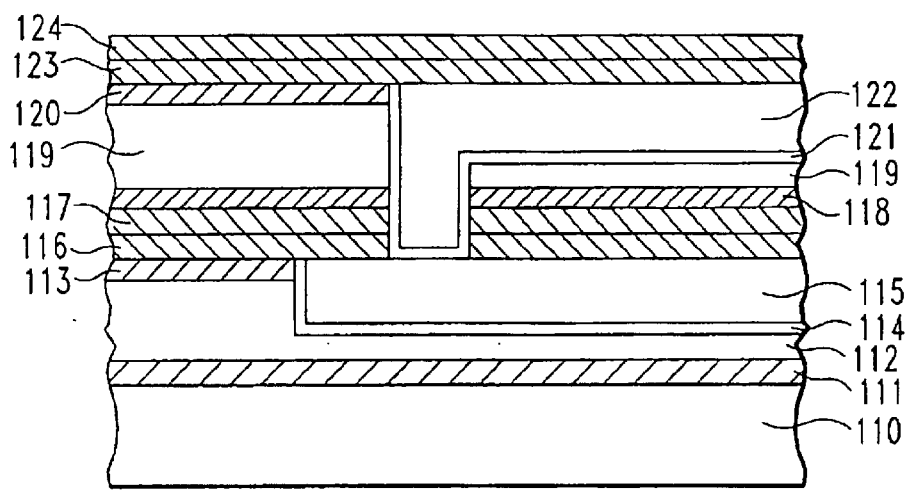
FIG. 2 is a schematic cross-sectional view of a partially-fabricated integrated circuit device illustrating an interconnect structure in accordance with a preferred embodiment of the invention.

Referring to FIG. 2, a preferred embodiment of the interconnect structure of the invention comprises a lower substrate 110 which may contain logic circuit elements such as transistors. A dielectric layer 112, commonly known as an inter-level dielectric (ILD), overlies the substrate 110. An adhesion promoter layer 111 may be disposed between the substrate 110 and ILD layer 112. A hardmask layer 113 is preferably disposed on ILD layer 112. At least one conductor 115 is embedded in ILD layer 112 and hardmask layer 113. A diffusion barrier liner 114 may be disposed between ILD layer 112 and conductor 115. The top surface of conductor 115 is made coplanar with the top surface of hardmask layer 113, usually by a chemical-mechanical polish (CMP) step. A first cap layer 116 is disposed on conductor 115 and hardmask layer 113, and a second cap layer 117 is disposed on first cap layer 116.

A first interconnect level is defined by adhesion promoter layer 111, ILD layer 112, hardmask layer 113, diffusion barrier liner 114, conductor 115, first cap layer 116, and second cap layer 117 in the interconnect structure shown in FIG. 2. A second interconnect level, shown above the first interconnect level in FIG. 2, includes adhesion promoter layer 118, ILD layer 119, hardmask layer 120, diffusion barrier liner 121, conductor 122, first cap layer 123, and second cap layer 124.

ILD layers 112 and 119 may be formed of any suitable dielectric material, although low-k dielectric materials are preferred. Suitable dielectric materials include carbon-doped silicon dioxide materials; fluorinated silicate glass (FSG); organic polymeric thermoset materials, silicon oxycarbide; SiCOH dielectrics; fluorine doped silicon oxide; spin-on glasses; silsesquioxanes, including hydrogen silsesquioxane (HSQ), methyl silsesquioxane (MSQ) and mixtures or copolymers of HSQ and MSQ; benzocyclobutene (BCB)-based polymer dielectrics, and any silicon-containing low-k dielectric. Examples of spin-on low-k films with SiCOH-type composition using silsesquioxane chemistry include HOSP™ (available from Honeywell), JSR 5109 and 5108 (available from Japan Synthetic Rubber), Zirkon™ (available from Shipley Microelectronics, a division of Rohm and Haas), and porous low-k (ELk) materials (available from Applied: Materials). Examples of carbon-doped silicon dioxide materials, or organosilanes, include Black Diamond™ (available from Applied Materials) and Coral™ (available from Novellus). An example of an HSQ material is FOx™ (available from Dow Corning). For this embodiment, preferred dielectric materials are organic polymeric thermoset materials, consisting essentially of carbon, oxygen and hydrogen. Preferred dielectric materials include the low-k polyarylene ether polymeric material known as SiLK™ (available from The Dow Chemical Company), and the low-k polymeric material known as FLARE™ (available from Honeywell). ILD layers 112 and 119 may each be about 100 nm to about 1000 nm thick, but these layers are each preferably about 600 nm thick. The dielectric constant for ILD layers 112 and 119 is preferably about 1.8 to about 3.5, and most preferably about 2.5 to about 2.9.

Alternatively, ILD layers 112 and 119 may be formed of a porous dielectric material, such as MesoELK™ (available from Air Products) and XLK™ (a porous version of FOx, available from Dow Corning). For example, If ILD layers 112 and 119 are formed of such porous dielectric material, the dielectric constant of these layers is preferably less than about 2.6, and is most preferably about 1.5 to 2.5. It is particularly preferred to use an organic polymeric thermoset material having a dielectric constant of about 1.8 to 2.2.

Adhesion promoter layers 111 and 118 are preferably about 9 nm thick, and may be composed of any material suitable for enhancing adhesion of the dielectric material in ILD layers 112 and 119 to the underlying surfaces. For example, if SiLK™ is used for ILD layers 112 and 119, adhesion promoter layers 111 and 118 may be formed of an adhesion promoter known as AP4000 (also available from The Dow Chemical Company).

Hardmask layers 113 and 120 may be formed of any suitable dielectric material. In one preferred embodiment, hardmask layers 113 and 120 are formed of silicon nitride, and preferably have a composition of about 30 to 45 atomic % silicon, about 30 to 55 atomic % nitrogen, and about 10 to 25 atomic % hydrogen. Most preferably, these silicon nitride hardmask layers have a composition of about 41 atomic % silicon, about 41 atomic % nitrogen, and about 17.5 atomic % hydrogen. Alternatively, in another preferred embodiment, hardmask layers 113 and 120 are formed of silicon carbide, and preferably have a composition of about 20 to 40 atomic % silicon, about 20 to 50 atomic % carbon and about 20 to 45 atomic % hydrogen. A particularly preferred composition is about 27 atomic % silicon, about 36 atomic % carbon and about 37 atomic % hydrogen.

Conductors 115 and 122 may be formed of any suitable conductive material, such as copper or aluminum. Copper is particularly preferred as the conductive material, due to its relatively low resistance. Copper conductors 115 and 122 may contain small concentrations of other elements. Diffusion barrier liners 114 and 121 may comprise one or more of the following materials: tantalum, titanium, tungsten and the nitrides of these metals.

First cap layers 116 and 123 may be formed of silicon nitride, silicon carbide, boron nitride or other suitable dielectric material, and are preferably formed using a HDP CVD process. It has been discovered that materials deposited using a HDP CVD process provide superior adhesion and superior electromigration resistance. However, materials exhibiting similar properties but deposited by other processes may also be used for first cap layers 116 and 123. First cap layers 116 and 123 are most preferably formed of HDP CVD silicon nitride having a composition of about 30 to 50 atomic % silicon, about 40 to 65 atomic % nitrogen and about 5 to 13 atomic % hydrogen. A particularly preferred composition for first cap layers 116 and 123 is about 40 atomic % silicon, about 52 atomic % nitrogen, and about 8 atomic % hydrogen. First cap layers 116 and 123 preferably each have a thickness in the range of about 25 to 700 Å, and most preferably in the range of about 50 to 350 Å.

Second cap layers 117 and 124 may be formed of silicon nitride, silicon carbide, boron nitride, silicon oxide or other suitable dielectric material, but are preferably formed using a PE CVD process. Second cap layers 117 and 124 are most preferably formed of PE CVD silicon nitride having a composition of about 30 to 45 atomic % silicon, about 40 to 65 atomic % nitrogen, and about 10 to 25 atomic % hydrogen. A particularly preferred composition for second cap layers 117 and 124 is about 37 atomic % silicon, about 48 atomic % nitrogen, and about 15 atomic % hydrogen. In another preferred embodiment, second cap layers 117 and 124 are formed of PE CVD amorphous hydrogenated silicon carbide having a composition of about 20 to 40 atomic % silicon, about 20 to 50 atomic % nitrogen, and about 20 to 45 atomic % hydrogen, most preferably about 27 atomic % silicon, about 36 atomic % carbon, and about 37 atomic % hydrogen. In yet another preferred embodiment, second cap layers 117 and 124 are formed of PE CVD amorphous hydrogenated nitrogenated silicon carbide having a composition of about 20 to 34 atomic % silicon, about 12 to 34 atomic % carbon, about 5 to 30 atomic % nitrogen and about 20 to 50 atomic % hydrogen, most preferably about 22 to 30 atomic % silicon, about 15 to 30 atomic % carbon, about 10 to 22 atomic % nitrogen and about 30 to 45 atomic % hydrogen. Second cap layers 117 and 124 preferably each have a thickness in the range of about 100 to 1000 Å, and most preferably in the range of about 250 to 700 Å.

Second cap layers 117 and 124 may be formed of a series of thin PE CVD films, where the total thickness is in the range of about 100 to 1000 Å. In one embodiment, these thin PE CVD films each may be formed of the same material, such as silicon nitride. In another embodiment, the thin PE CVD films may be formed of different materials, such as silicon nitride, silicon carbide, silicon oxide, silicon oxycarbide, and/or silicon oxycarbonitride. The second cap layer also may be formed of alternating layers of high-permeability or high-affinity dielectric films and low-permeability or low-affinity dielectric films, such as the laminated diffusion barrier described in co-pending U.S. application Ser. No. 09/858,687, filed May 16, 2001 and titled "Laminated Diffusion Barrier," the disclosure of which is incorporated herein by reference. The second cap layer may comprise alternating films of different material or a series of films of the same material together with films of a different material. For example, the second cap layer may comprise: three thin films of PE CVD silicon nitride, each having a thickness of about 5 nm; a thin film of PE CVD silicon oxide having a thickness of about 5 nm; a thin film of PE CVD silicon nitride having a thickness of about 5 nm; and a thin film of PE CVD silicon nitride having a thickness of about 5 nm. As another example, the second cap layer may be formed of a series of PE CVD films comprising: a thin film of PE CVD silicon nitride having a thickness of about 5 nm; a thin film of PE CVD silicon oxide having a thickness of about 5 nm; a thin film of PE CVD silicon nitride having a thickness of about 5 nm; a thin film of PE CVD silicon oxide having a thickness of about 5 nm; a thin film of PE CVD silicon nitride having a thickness of about 5 nm; and a thin film of PE CVD silicon oxide having a thickness of about 5 nm. The series of films may comprise up to 6 layers of the same or different material, or may comprise more than 6 layers of the same or different material.

Alternatively, second cap layers 117 and 124 may be formed by a physical vapor deposition (PVD) process, by a spin-on process, or even by a HDP CVD process using process parameters different from those used for the first cap layer.

The interconnect structure of FIG. 2 may be formed by a damascene or dual damascene process, such as the process shown in FIGS. 3(a)–3(j). The process preferably begins with deposition of adhesion promoter layer 111 on substrate 110, and is followed by deposition of ILD layer 112 on adhesion promoter layer 111, as shown in FIG. 4(a). Adhesion promoter layer 111 and ILD layer 112 may be deposited by any suitable method. For example, if adhesion promoter layer 111 is formed of AP4000, the adhesion promoter solution may be applied by a spin-coating process, followed by a baking step. If SiLK™ is used for ILD layer 112, the resin may be applied by a spin-coating process, followed by a baking step to remove solvent and then a thermal curing step.

Figure 3A:
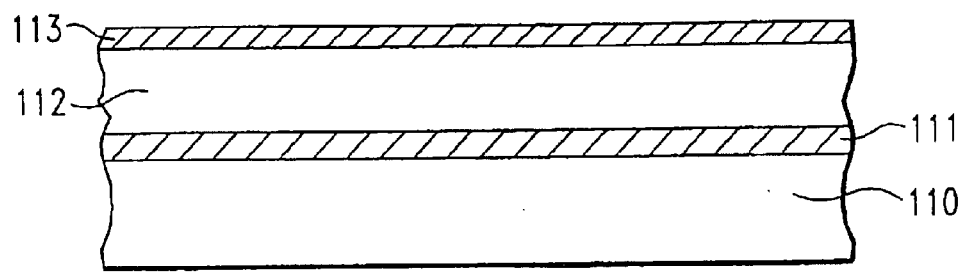
FIGS. 3(a)–3(j) illustrate a method for forming the interconnect structure of FIG. 2.

Hardmask layer 113 is then deposited on ILD layer 112, as shown in FIG. 3(a). Hardmask layer 113 may be deposited by any suitable method, but is preferably deposited by chemical vapor deposition (CVD) directly onto ILD layer 112. In one preferred embodiment, a silicon nitride hardmask layer 113 is deposited in a CVD reactor at a pressure in the range of about 0.1 to 10 torr, most preferably in the range of about 1 to 5 torr, using a combination of gases that may include, but are not limited to, silane ($SiH_4$), ammonia ($NH_3$), nitrogen ($N_2$) and helium (He). A typical deposition process uses a flow of $SiH_4$ in the range of about 100 to 700 sccm, a flow of $NH_3$ in the range of about 100 to 5000 sccm, and a flow of $N_2$ in the range of about 100 to 5000 sccm. The deposition temperature is typically within the range of about 150 to 500° C., most preferably in the range of about 350 to 450° C. The high-frequency radio-frequency (RF) power is typically in the range of about 50 to 700 watts per showerhead, and the low frequency RF power is typically in the range of about 50 to 500 watts per showerhead. The final deposition thickness is preferably in the range of about 10 to 100 nm, and most preferably in the range of about 25 to 70 nm. This silicon nitride hardmask film preferably has a composition of about 30 to 45 atomic % silicon, about 30 to 55 atomic % nitrogen, and about 10 to 25 atomic % hydrogen. Most preferably, this silicon nitride hardmask film has a composition of about 41 atomic % silicon, about 41 atomic % nitrogen, and about 17.5 atomic % hydrogen.

In another preferred embodiment, a silicon carbide hardmask layer 113 is deposited in a CVD reactor at a pressure of about 0.1 to 20 torr, most preferably in the range of about 1 to 10 torr, using a combination of gases that may include, but are not limited to, $SiH_4$, $NH_3$, $N_2$, He, trimethylsilane (3MS), and/or tetramethylsilane (4MS). A typical deposition process uses a flow of 3MS in the range of about 50 to 500 sccm and a flow of He in the range of about 50 to 2000 sccm. The deposition temperature is typically within the range of about 150 to 500° C., most preferably in the range of about 300 to 400° C. The RF power is typically in the range of about 150 to 700 watts per showerhead, most preferably in the range of about 100 to 500 watts per showerhead. The final deposition thickness is preferably in the range of about 10 to 100 nm, and most preferably in the range of about 25 to 70 nm. This amorphous hydrogenated silicon carbide hardmask film preferably has a composition of about 27 atomic % silicon, about 36 atomic % carbon and about 37 atomic % hydrogen.

Hardmask layer 113 may function as a patterning layer to assist in later etching of ILD layer 112 to form a trench for conductor 115. Hardmask layer 113 may also serve as a polish stop layer during a subsequent CMP step to remove excess metal.

Following deposition of a silicon nitride or silicon carbide hardmask film, as described above, additional sacrificial hardmask layers (not shown) may be deposited. For example, a series of hardmask layers may be deposited, such as the hardmask layers described in co-pending U.S. patent application Ser. No. 09/550,943, filed Apr. 14, 2000 and titled "Protective Hardmask for Producing Interconnect Structures," the disclosure of which is incorporated herein by reference. Alternatively, an additional silicon nitride film may be deposited, followed by a silicon oxide deposition. In one preferred embodiment, an additional silicon nitride hardmask film is deposited in a CVD reactor at a pressure in the range of about 0.1 to 10 torr, most preferably in the range of about 1 to 5 torr, using a combination of gases that may include, but are not limited to, $SiH_4$, $NH_3$, $N_2$ and/or He. A typical deposition process uses a flow of $SiH_4$ in the range of about 100 to 700 sccm, a flow of $NH_3$ in the range of about 100 to 5000 sccm, and a flow of $N_2$ in the range of about 100 to 5000 sccm. The deposition temperature is typically within the range of about 150 to 500° C., most preferably in the range of about 350 to 450° C. The high frequency RF power is typically in the range of about 50 to 700 watts per showerhead, and the low frequency RF power is typically in the range of about 50 to 500 watts per showerhead. The final deposition thickness is preferably in the range of about 10 to 100 nm, most preferably in the range of about 25 to 60 nm. This additional silicon nitride hardmask film preferably has a composition of about 41 atomic % silicon, about 41 atomic % nitrogen, and about 17.5 atomic % hydrogen.

The subsequent silicon oxide hardmask layer is deposited in a CVD reactor at a pressure in the range of about 0.1 to 10 torr, most preferably in the range of about 1 to 5 torr, using a combination of gases that may include, but are not limited to, $SiH_4$, $N_2O$, $N_2$, and $O_2$. A typical deposition uses a flow of $SiH_4$ in the range of about 10 to 700 sccm, a flow of $N_2O$ in the range of about 100 to 20000 sccm, and a flow of $N_2$ in the range of about 100 to 3000 sccm. The deposition temperature is typically in the range of about 150 to 500° C., most preferably in the range of about 350 to 450° C. RF power is typically in the range of about 150 to 500 watts per showerhead, most preferably in the range of about 50 to 3000 watts per showerhead. The final deposition thickness is preferably in the range of about 30 to 250 nm, most preferably in the range of about 50 to 200 nm. This additional silicon oxide hardmask layer preferably has a composition of about 33 atomic % silicon, about 63 atomic % oxygen, and less than about 1 atomic % hydrogen.

Figure 3B:
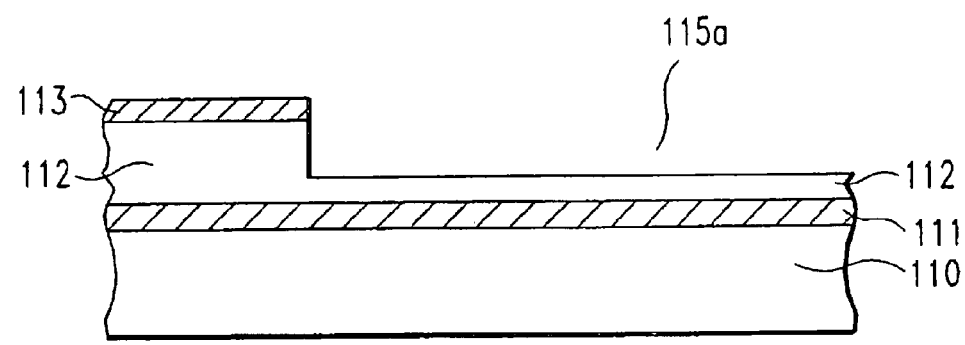
Figure 3C:
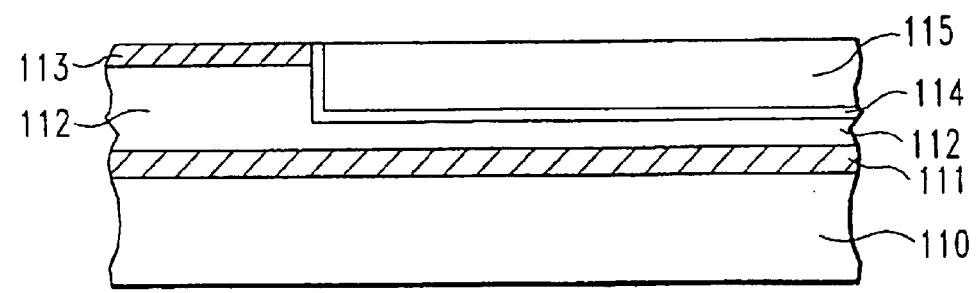

In FIG. 3(b), at least one trench 115a is formed using a conventional photolithography patterning and etching process. In a typical photolithography process, a photoresist material (not shown) is deposited on hardmask layer 113. The photolithography material is exposed to ultraviolet (UV) radiation through a mask, and then the photoresist material is developed. Depending on the type of photoresist material used, exposed portions of the photoresist may be rendered either soluble or insoluble during development. These soluble portions of the photoresist are then removed, leaving behind a photoresist pattern matching the desired pattern of trenches. Trench 115a is then formed by removing hardmask layer 113 and a portion of ILD layer 112 by, for example, reactive ion etching (RIE), in areas not protected by the photoresist. Hardmask layer 113 may assist in this etching step as follows. Hardmask layer 113 may be etched first in areas not covered by the photoresist, then the photoresist may be removed, leaving behind a patterned hardmask layer 113 matching the photoresist pattern. Then, ILD layer 112 may be etched in areas not covered by hardmask layer 113.

Following formation of trench 115a, the trench is preferably lined with diffusion barrier liner 114, and then a conductive material is deposited in trench 115a to form conductor 115. Diffusion barrier liner 114 may be deposited by any suitable method, such as by physical vapor deposition (PVD), chemical vapor deposition (CVD) or ionized physical vapor deposition (I-PVD). Conductive material 115 may deposited in trench 115a by any suitable method, such as by plating technology. Excess liner 114 and conductive material 115 may be removed in a CMP process, in which the top surface of conductor 115 is made coplanar with the top surface of hardmask layer 113. Hardmask layer 113 may serve as a polish-stop layer during this CMP step, thereby protecting ILD layer 112 from damage during polishing. Sacrificial hardmask layers (not shown) may also be removed during this CMP step.

Figure 3D:
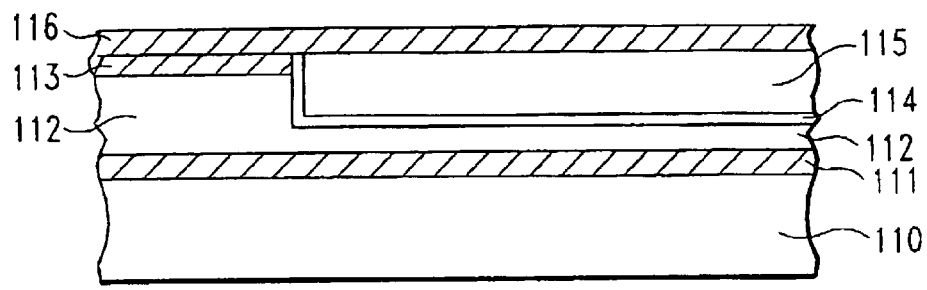

First cap layer 116 is then deposited on conductor 115 and hardmask layer 113, as shown in FIG. 3(d). First cap layer 116 is preferably deposited by a HDP CVD process, but may be deposited by other processes such as by PVD, PE CVD, or spin-on techniques. First cap layer 116 may be formed of silicon nitride, silicon carbide, boron nitride or other suitable dielectric material.

Most preferably, first cap layer 116 is a HDP CVD silicon nitride film deposited in a CVD reactor at a pressure in the range of about 0.1 to 50 milli-torr, most preferably at a pressure in the range of about 5 to 20 milli-torr. The deposition gases may include, but are not limited to, $SiH_4$, $N_2$, and Ar or He. A typical deposition uses a flow of $SiH_4$ in the range of about 5 to 125 sccm, a flow of $N_2$ in the range of about 50 to 1000 sccm, and a flow of Ar in the range of about 20 to 1000 sccm. The deposition temperature is typically in the range of about 200 to 500° C., with a range of about 300 to 450° C. most preferred. Radiofrequency (RF) power is typically in the range of about 1700 to 2500 watts per showerhead, and most preferably in the range of about 1750 to 1950 watts per showerhead. The final deposition thickness is preferably in the range of about 25 to 700 Å, and most preferably in the range of about 50 to 350 Å. This HDP silicon nitride cap layer preferably has a composition of about 30 to 50 atomic % silicon, about 40 to 65 atomic % nitrogen, and about 5 to 13 atomic % hydrogen, most preferably about 40 atomic % silicon, about 52 atomic % nitrogen, and about 8 atomic % hydrogen.

Figure 3E:
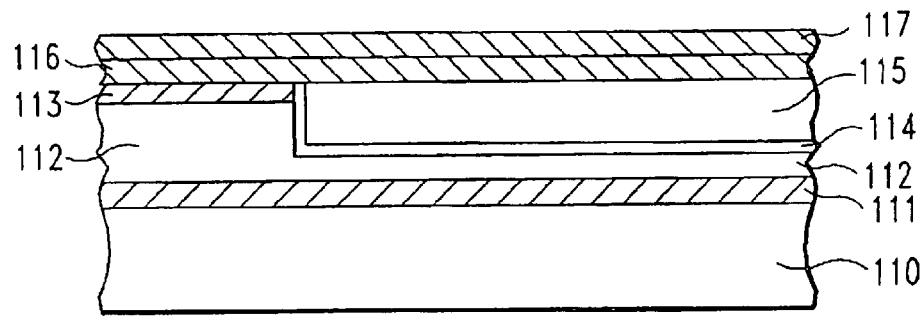

Following deposition of first cap layer 116, a second cap layer 117 is deposited, as shown in FIG. 3(e). Second cap layer 117 is preferably deposited by a PE CVD process, but may also be deposited by a physical vapor deposition (PVD) process, by a spin-on process, or even by a HDP CVD process using process parameters different from those used for the first cap layer. Second cap layer 117 may be formed of silicon nitride, silicon carbide, boron nitride or other suitable dielectric. These PE CVD films may be either hydrogenous or amorphous or both. While it is most preferred that deposition of second cap layer 117 occurs without interruption of the vacuum environment of the first cap layer 116 deposition and without exposing the substrate to atmospheric pressure, it is possible for the second cap layer deposition to occur with a vacuum interruption after the first cap layer 116 deposition.

In a most preferred embodiment, second cap layer 117 is a PE CVD silicon nitride layer, and is deposited in a CVD reactor at a pressure in the range of about 0.1 to 10 torr, most preferably in the range of about 1 to 7 torr, using a combination of gases that may include, but are not limited to, $SiH_4$, $NH_3$, $N_2$ and He. A typical deposition uses a flow of $SiH_4$ in the range of about 10 to 500 sccm, a flow of $NH_3$ in the range of about 100 to 3000 sccm, and a flow of $N_2$ in the range of about 500 to 25000 sccm. The deposition temperature is typically in the range of about 150 to 500° C., most preferably in the range of about 350 and 450° C. The high frequency RF power is typically in the range of about 25 to 700 watts per showerhead, most preferably in the range of about 50 to 250 watts per showerhead. The low frequency RF power is typically in the range of about 0 to 500 watts per showerhead. The final deposition thickness is preferably in the range of about 100 to 1000 Å, and most preferably in the range of about 250 to 700 Å. This PE CVD silicon nitride cap layer preferably has a composition of about 30 to 45 atomic % silicon, about 40 to 65 atomic % nitrogen, and about 10 to 25 atomic % hydrogen. A particularly preferred composition for second cap layer 117 is about 37 atomic % silicon, about 48 atomic % nitrogen, and about 15 atomic % hydrogen.

In another preferred embodiment, second cap layer 117 is a PE CVD amorphous hydrogenated silicon carbide layer, and is deposited in a CVD reactor at a pressure in the range of about 0.1 to 20 torr, most preferably in the range of about 1 to 10 torr, using a combination of gases that may include, but is not limited to, $SiH_4$, $NH_3$, $N_2$, He, trimethylsilane (3MS), or tetramethylsilane (4MS). A typical deposition uses a flow of 3MS in the range of about 50 to 500 sccm, and a flow of He in the range of about 50 to 2000 sccm. The deposition temperature is typically in the range of about 150 to 500° C., most preferably in the range of about 300 to 400° C. The RF power is typically in the range of about 150 to 700 watts per showerhead, most preferably in the range of about 100 to 500 watts per showerhead. The final deposition thickness is preferably in the range of about 100 to 1000 Å, and most preferably in the range of about 250 to 700 Å. This amorphous hydrogenated silicon carbide film preferably has a composition of about 20 to 40 atomic % silicon, about 20 to 50 atomic % carbon, and about 20 to 45 atomic % hydrogen, most preferably about 27 atomic % silicon, about 36 atomic % carbon, and about 37 atomic % hydrogen.

In yet another preferred embodiment, second cap layer 1117 is a PE CVD amorphous hydrogenated nitrogenated silicon carbide layer, and is deposited in a CVD reactor at a pressure in the range of about 0.1 to 20 torr, most preferably in the range of about 1 to 10 torr, using a combination of gases that may include, but is not limited to, $SiH_4$, $NH_3$, $N_2$, He, 3MS, 4MS and other methyl silanes. This second cap layer 117 is preferably deposited using 3MS or 4MS at a flow rate in the range of about 50 to 500 sccm, and $N_2$ at a flow rate in the range of about 50 to 500 sccm. The deposition temperature is preferably in the range of about 150 to 500° C., most preferably in the range of about 300 to 400° C. The RF power is preferably in the range of about 100 to 700 watts per showerhead, most preferably in the range of about 200 to 500 watts. The final deposition thickness is preferably in the range of about 100 to 1000 Å, and most preferably in the range of about 250 to 700 Å. This amorphous hydrogenated nitrogenated silicon carbide film preferably has a composition of about 20 to 34 atomic % silicon, about 12 to 34 atomic % carbon, about 5 to 30 atomic % nitrogen and about 20 to 50 atomic % hydrogen, most preferably about 22 to 30 atomic % silicon, about 15 to 30 atomic % carbon, about 10 to 22 atomic % nitrogen and about 30 to 45 atomic % hydrogen.

Second cap layer 117 may be formed of a series of thin PE CVD films, where the total thickness is in the range of about 100 to 1000 Å. These thin PE CVD films may be formed of the same material, such as silicon nitride, or they may be formed of different or alternating materials, such as silicon nitride, silicon carbide, silicon oxide, silicon oxycarbide and/or silicon oxycarbonitride. As discussed previously, second cap layer 117 may comprise alternating films of different material or a series of films of the same material together with films of a different material.

Prior to deposition of first cap layer 116, a plasma pre-cleaning step may be performed in the CVD reactor. A typical plasma pre-cleaning step uses a source of hydrogen such as $NH_3$ or $H_2$ at a flow rate in the range of about 50 to 700 sccm, and is performed at a substrate temperature in the range of about 15 to 500° C., most preferably at a substrate temperature in the range of about 20 to 400° C., for a time of about 5 to 500 seconds and most preferably about 10 to 100 seconds. The RF power is in the range of about 100 to 10,000 watts, and most preferably in the range of about 1000 to 5000 watts during this cleaning step. Optionally, other gases such as He, argon (Ar) or $N_2$ may be added at a flow rate in the range of about 50 to 20,000 sccm.

Figure 3F:
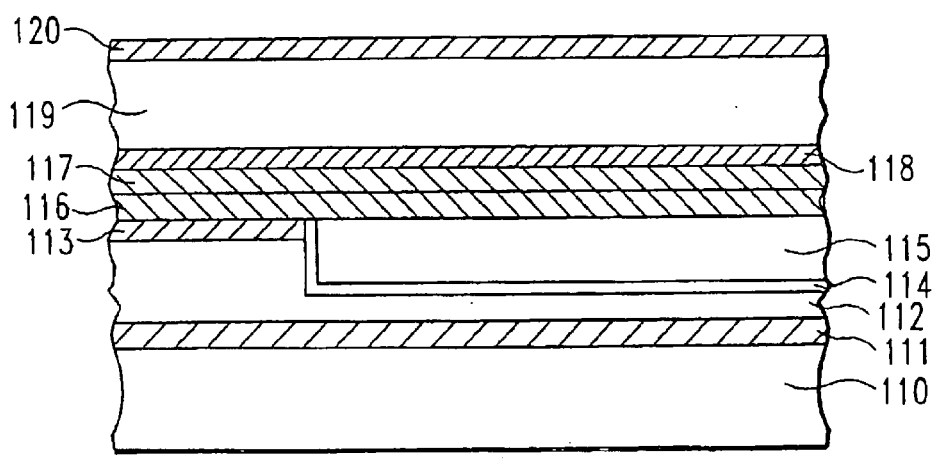

FIGS. 3(a)–3(e) illustrate the formation of the first interconnect level, which consists of adhesion promoter layer 111, ILD layer 112, hardmask layer 113, diffusion barrier liner 114, conductor 115, first cap layer 116, and second cap layer 117. In FIG. 3(f), the formation of the second interconnect level begins with deposition of adhesion promoter layer 118, ILD layer 119 and hardmask layer 120. Adhesion promoter layer 118 may be deposited using the same method as that for adhesion promoter layer 111. Likewise, ILD layer 119 may be deposited using the same method as that for ILD layer 112, and hardmask layer 120 may be deposited using the same method as that for hardmask layer 113. Additional sacrificial hardmask layers (not shown) may be deposited on primary hardmask layer 120.

Figure 3G:
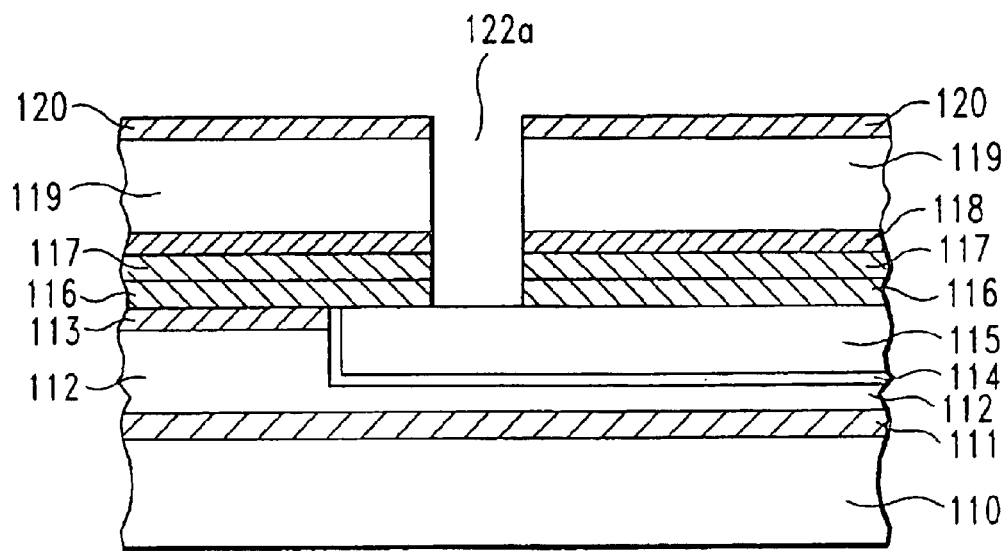
Figure 3H:
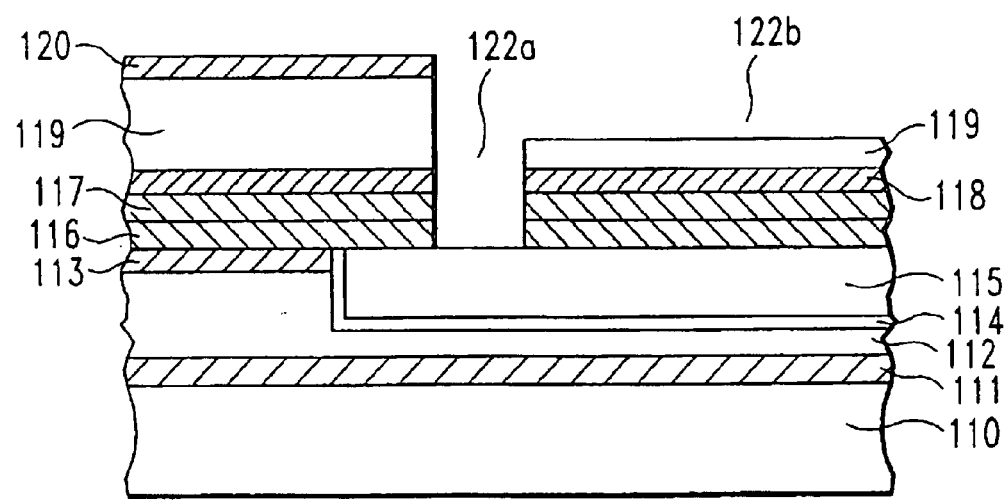

FIGS. 3(g) and 3(h) illustrate the formation of via 122a and trench 122b. First, at least one via 122a may be formed in hardmask layer 120, ILD layer 119, adhesion promoter layer 118 and cap layers 117 and 116, using a conventional photolithography patterning and etching process, as shown in FIG. 3(g). Then, at least one trench 122b may be formed in hardmask layer 120 and a portion of ILD layer 119, using a conventional photolithography process, as shown in FIG. 3(h). Via 122a and trench 122b may be formed using the same photolithography process as that used to form trench 115a.

Alternatively, via 122a and trench 122b may be formed by first patterning and etching a trench in hardmask layer 120 and ILD layer 1119, where the trench has a depth equal to the depth of trench 122b, but has a length equal to the length of trench 122b and the width of via 122a combined. Then via 122a may then be formed by etching through the remainder of ILD layer 119, adhesion promoter layer 118 and cap layers 117 and 116.

Figure 3I:
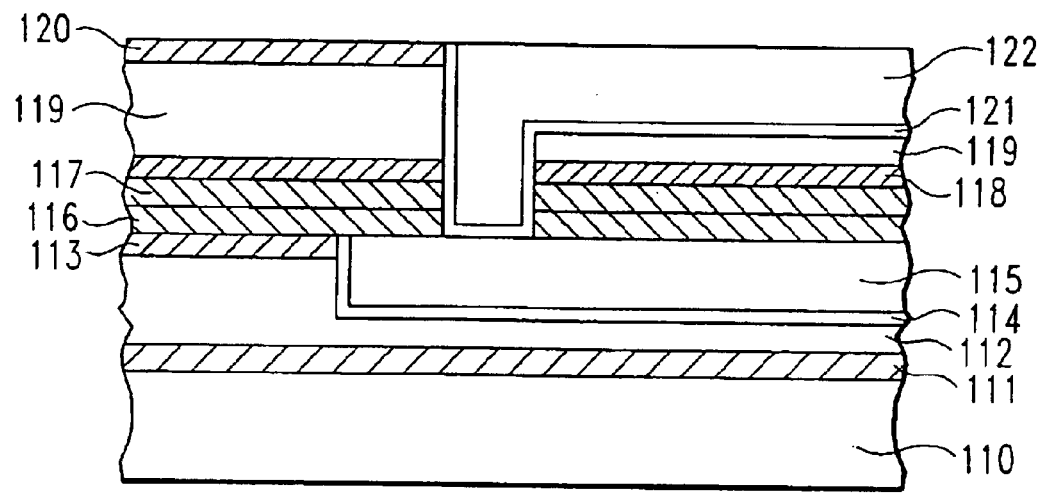

Following formation of via 122a and trench 122b, the via and trench are preferably lined with diffusion barrier liner 121, and then a conductive material is deposited in the via and trench to form conductor 122, as shown in FIG. 3(i). Diffusion barrier liner 121 may be deposited by the same method used for diffusion barrier liner 114, and conductive material 122 may deposited by the same method used for conductor 115. Excess liner 121 and conductive material 122 may be removed in a CMP process, in which the top surface of conductor 122 is made coplanar with the top surface of hardmask layer 120. Sacrificial hardmask layers (not shown) may also be removed during this CMP step. Hardmask layer 120 may serve as a polish-stop layer during this CMP step, thereby protecting ILD layer 119 from damage during polishing.

Figure 3J:
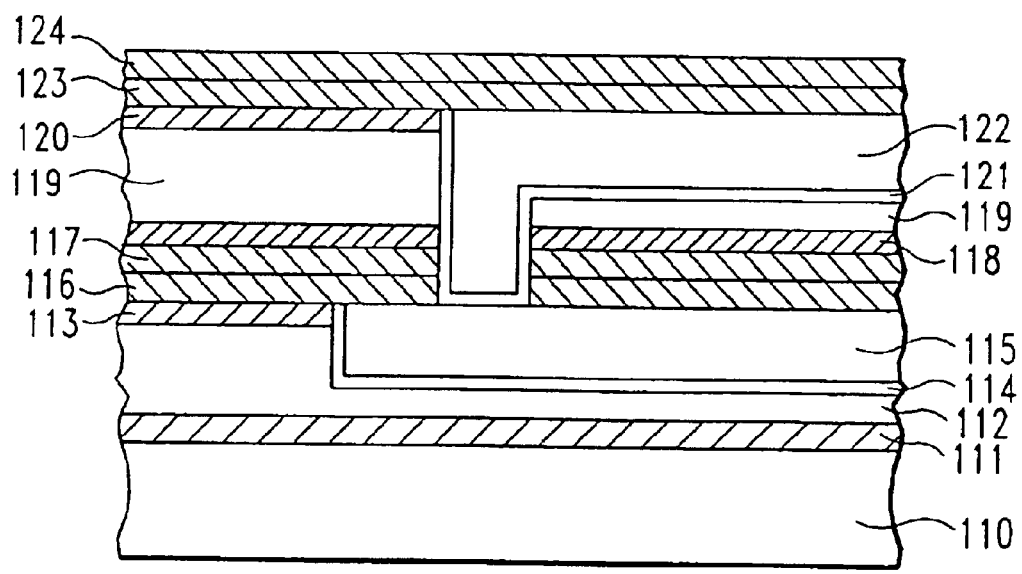

Cap layers 123 and 124 are then deposited on conductor 122 and hardmask layer 120, as shown in FIG. 3(j). First cap layer 123 may be deposited using the same process as that for first cap layer 116, and second cap layer 124 may be deposited using the same process as that for second cap layer 117.

While the present invention has been particularly described in conjunction with a specific preferred embodiment and other alternative embodiments, it is evident that numerous alternatives, modifications and variations will be apparent to those skilled in the art in light of the foregoing description. It is therefore intended that the appended claims embrace all such alternatives, modifications and variations as falling within the true scope and spirit of the present invention.

We claim:

1. An interconnect structure formed on a substrate, the structure comprising:

a dielectric layer overlying the substrate;

a hardmask layer on said dielectric layer, said hardmask layer having a top surface;

at least one conductor embedded in said dielectric layer and having a surface coplanar with the top surface of said hardmask layer;

a first cap layer on said at least one conductor and on said hardmask layer, wherein said first cap layer is formed by a high density plasma chemical vapor deposition (HDP CVD) process; and at least one second cap layer on said first cap layer, wherein said second cap layer is formed by a plasma-enhanced chemical vapor deposition (PE CVD) process.

2. The interconnect structure according to claim 1, further comprising a conductive liner disposed between said conductor and said dielectric layer.

3. The interconnect structure according to claim 1, further comprising an adhesion promoter layer disposed between said dielectric layer and the substrate.

4. The interconnect structure according to claim 1, wherein said dielectric layer is formed of an organic thermoset polymer having a dielectric constant of about 1.8 to about 3.5.

5. The interconnect structure according to claim 4, wherein said dielectric layer is formed of a polyarylene ether polymer.

6. The interconnect structure according to claim 1, wherein said first cap layer is formed of a dielectric material selected from the group consisting of silicon nitride, silicon carbide and boron nitride.

7. The interconnect structure according to claim 1, wherein said first cap layer is formed of silicon nitride having a composition of about 40 atomic % silicon, about 52 atomic % nitrogen, and about 8 atomic % hydrogen.

8. The interconnect structure according to claim 1, wherein said second cap layer is formed of a dielectric material selected from the group consisting of silicon nitride, silicon carbide and boron nitride.

9. The interconnect structure according to claim 1, wherein said second cap layer is formed of silicon nitride having a composition of about 37 atomic % silicon, about 48 atomic % nitrogen, and about 15 atomic % hydrogen.

10. The interconnect structure according to claim 1, wherein said second cap layer is formed of silicon carbide having a composition of about 27 atomic % silicon, about 36 atomic % carbon, and about 37 atomic % hydrogen.

11. The interconnect structure according to claim 1, wherein said second cap layer is formed of amorphous hydrogenated nitrogenated silicon carbide having a composition of about 22 to 30 atomic % silicon, about 15 to 30 atomic % carbon, about 10 to 22 atomic % nitrogen and about 30 to 45 atomic % hydrogen.

12. The interconnect structure according to claim 1, wherein said conductor comprises copper.

13. The interconnect structure according to claim 1, wherein said second cap layer comprises a plurality of thin films each formed by a plasma-enhanced chemical vapor deposition (PE CVD) process.

14. The interconnect structure according to claim 13, wherein the plurality of thin films comprises at least one silicon nitride film and at least one film selected from the group consisting of silicon oxide, silicon carbide, boron nitride, silicon oxycarbide and silicon oxycarbonitride.

15. The interconnect structure according to claim 13, wherein each thin film has a thickness of about 50 Å.

16. The interconnect structure according to claim 1, wherein said first cap layer has a thickness of about 25 to 700 Å.

17. The interconnect structure according to claim 1, wherein said second cap layer has a thickness of about 10 to 1000 Å.

* * * * *